United States Patent [19]

Sexton

[11] Patent Number: 4,598,214
[45] Date of Patent: Jul. 1, 1986

[54] LOW POWER SHIFT REGISTER LATCH

[75] Inventor: Joe F. Sexton, Houston, Tex.

[73] Assignee: Texas Instruments Incorporated, Dallas, Tex.

[21] Appl. No.: 547,524

[22] Filed: Oct. 31, 1983

[51] Int. Cl.$^4$ .................. G11C 11/40; G11C 19/28
[52] U.S. Cl. .................. 307/291; 307/453; 307/481; 307/279; 377/79; 377/105
[58] Field of Search .............. 307/443, 448, 453, 481, 307/279, 291, 296 R; 377/64, 72–74, 77–79, 105, 117

[56] References Cited

U.S. PATENT DOCUMENTS

| | | | |
|---|---|---|---|
| 4,042,841 | 8/1977 | Hills et al. | 307/448 X |
| 4,084,106 | 4/1978 | Ullrich | 377/79 |
| 4,100,429 | 7/1978 | Adachi | 307/279 X |
| 4,101,790 | 7/1978 | Ebihara et al. | 307/279 X |
| 4,216,389 | 8/1980 | Carter | 307/448 X |
| 4,387,294 | 7/1983 | Nakamura et al. | 377/78 |
| 4,506,165 | 3/1985 | Gulati et al. | 307/443 X |

Primary Examiner—Stanley D. Miller
Assistant Examiner—D. R. Hudspeth
Attorney, Agent, or Firm—Robert D. Marshall, Jr.; N. Rhys Merrett; Melvin Sharp

[57] ABSTRACT

A combination of logic circuits perform logical operations on data and include a plurality of shift register latches. Each shift register latch includes a latch means for the storing of data, an isolation means for isolating the latch means from data and clock signals connected logic circuits when the isolation means is at a first state, and for conducting data to the latch means when the isolation means is at a second state. Each shift register latch also includes a power reduction means for reducing the power consumed by the isolation means and the latch means.

4 Claims, 8 Drawing Figures

LOW POWER SHIFT REGISTER LATCH

BACKGROUND OF THE INVENTION

This invention relates to logic circuits configured with field effect transistors, more particularly to logic circuits configured with field effect transistors to form a latch and in particular, a shift register latch.

Figure 1:
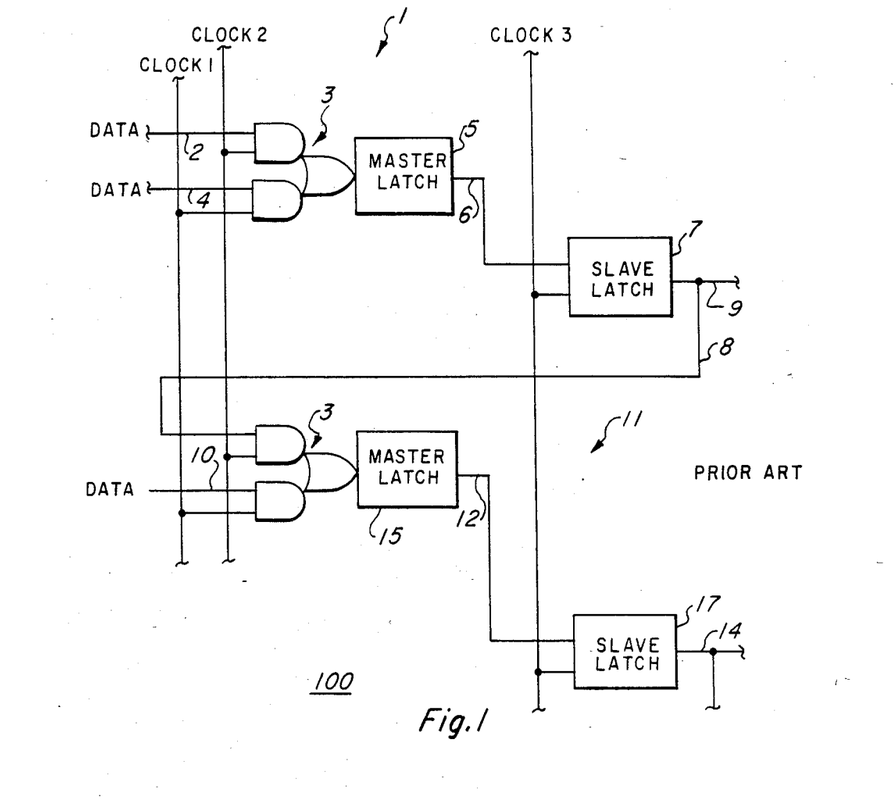
FIG. 1 is a logic diagram of a prior art shift register latch.

An example of the prior art shift register latch is provided in FIG. 1, in which there is a first latch stage 1 and a second latch stage 11. The first latch stage receives inputs in the form of logic signal levels representing data at a combination logic, at the occurrence of clock 2, the data on terminal 2 is loaded into a master latch 5 and at the occurrence of clock 1 the data on terminal 4 is also loaded into the master latch 5. The master latch 5 stores the data and provides a representative sample of the data that is stored therein on its output terminal 6, which at the occurrence of clock 3 is loaded into a slave latch 7. The master latch 5 stores the data internally until the occurrence of a clock 3, when it is stored in the slave latch 7. The slave latch 7 stores the data, as well as provides a representative sample of the stored data on terminal 8 and 9 for application to the second stage shift register latch 11. The second stage shift register latch 11 includes an input combination circuit 13, which in the embodiment of FIG. 1, is an AND-OR combination, a master latch 15 and a slave latch 17. The master latch 15, at the occurrence of either clock 1 or 2 will store either the data that is on terminal 8 or 10, respectively, and present a representation thereof on terminal 12 for application to the slave latch 17, which will store the logic level that is present on terminal 12 at the occurrence of clock 3, and present a representative signal therof on its output terminal 14.

Figure 2:
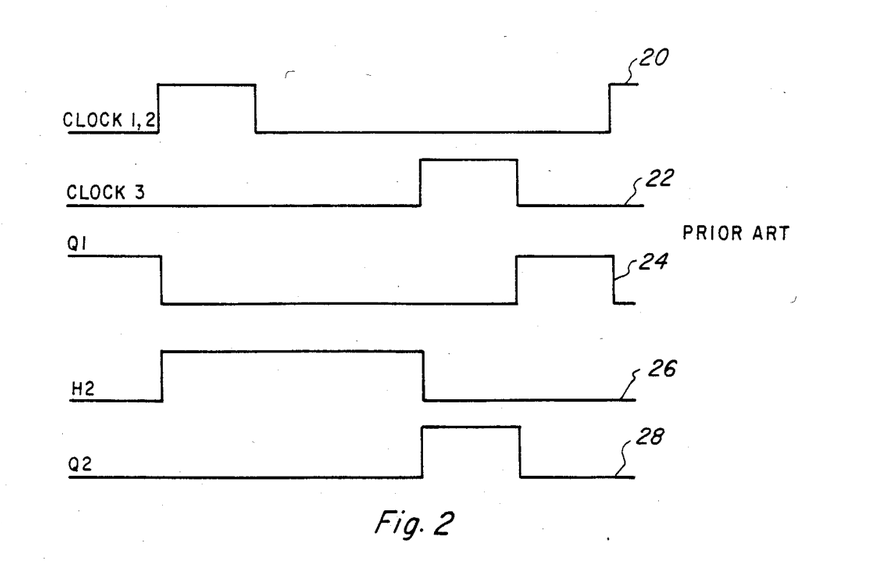
FIG. 2 is a timing diagram of the prior art shift register latch of FIG. 1.

In FIG. 2, to which reference should now be made, there is illustrated a waveform diagram of the shift register latch of FIG. 1, which is, in the embodiment shown in FIG. 1, a prior art representation of a level sensitive, shift register latch. There are 3 clocks provided to the shift register latch necessary for the shift register latch 100 of FIG. 1 to operate. They are clocks 1 and 2, which store the data into the master latches 5 and 15, and clock 3, which loads data into the slave latches 7 and 13. Clock 1 and 2 is represented by waveform 20, and clock 3 is represented by waveform 22. The internal operation of the shift register latch 100 requires the internal generation of several clock pulses, which are Q1, represented by waveform 24, and provides a logic 1 indication between the falling edge of clock 3 and the rising edge of clock 1. Waveform 28 is a Q4 signal, and, in the embodiment of FIG. 1, is identical to the clock 3 signal that is represented by waveform 22. Waveform 26 is also an internally-generated clock signal that is used by the shift register latch 100 and represents the DOT product of the Q1 signal, represented by waveform 24, and the Q4 signal, represented by waveform 28. These signals normally are generated by a clock circuit that is contained internally to a shift register latch circuit 100 from the clock 1, clock 2, and clock 3 signals.

The shift register latch disclosed in FIG. 1, when implemented through field effect transistor technology, requires the multiple clocking arrangements that are indicated in FIG. 2, and also, requires that in the combination logics 3 and 13, decisions must be completed by the trailing edge of clock 1 that is represented by waveform 20. This creates a problem in the field effect transistor logic when clock 3 is to be used to discharge the last stage of the combination logic, which is a necessary requirement for speed enhancement of the device. Therefore, the prior art shift register latch is limited and generally inappropriate for high-speed application.

SUMMARY OF THE INVENTION

A combination of logic circuits perform logical operations on data and include a plurality of shift register latches. Each shift register latch includes a latch means for the storing of data, an isolation means for isolating the latch means from data and clock signals in connected logic circuits when the isolation means is at a first state, and for conducting data to the latch means when the isolation means is at a second state. Each shift register latch also includes a power reduction means for reducing the power consumed by the isolation means and the latch means.

The latch means are comprised of two field effect transistor circuits where each circuit is configured as an inverter. The inverters provide, on their output terminal, a complement of the signal that is applied to each input terminal and, are connected together serially. A controllable feedback circuit connects the output of the second member of the serial combination of the two inverter circuits to the input of the first member of the serial combination of the two inverter circuits.

Each of the field effect transistor circuits includes two depletion transistors and an enhancement transistor having a gate for use as an input, a source for biasing of the transistor, and a drain connected to a reference potential. The first depletion transistor has a gate for receipt of an activate signal, a drain connected to the source of the enhancement transistor, and a source for receiving the bias signal. The second depletion transistor has a gate for receiving a second activate signal, a drain connected to the source of the first depletion transistors, and a source for receiving a bias signal.

The shift register latch that is disclosed also includes a circuit checking means for checking data flow through the shift register latch as well as through a plurality of shift register latches that are connected together.

Additionally, there is disclosed an embodiment of the invention that includes an output buffer means for buffering the output of the latch means.

These and other features and objects of the invention will be more apparent from a reading of the specification in combination with the figures, along with the brief description of the drawings in which:

DETAILED DESCRIPTION OF THE PREFERRED EMBODIMENT

Figure 3:
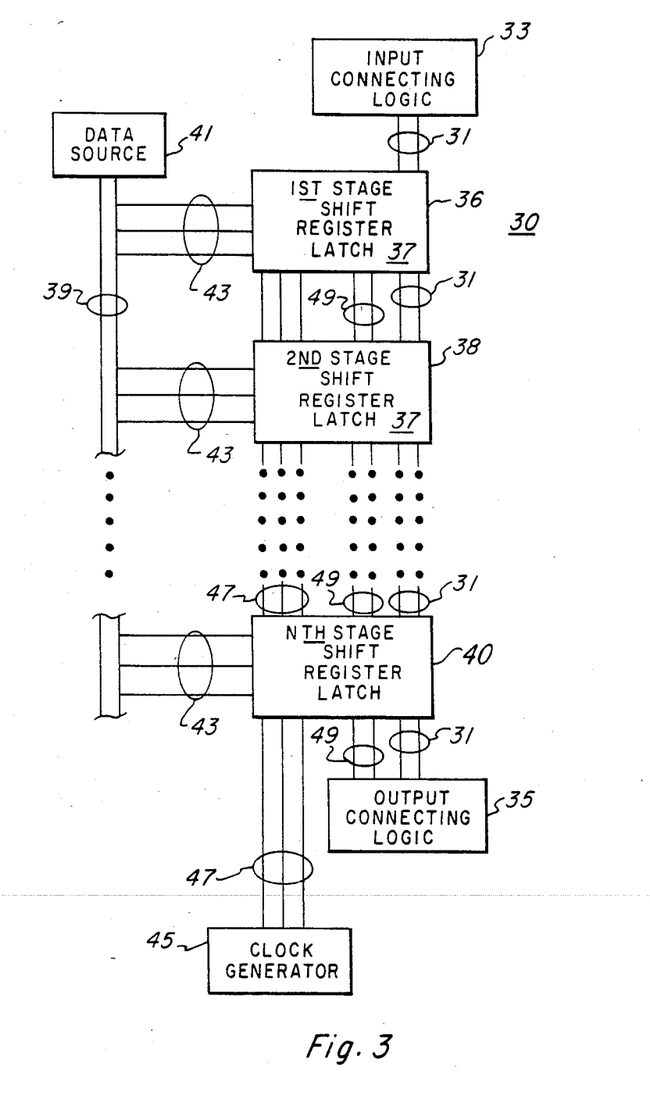
FIG. 3 is a block diagram of a plurality of shift register latches connected together to provide a combination of logic circuits that will perform a complex logic operations.

In FIG. 3, to which reference should now be made, there is shown a block diagram of a logic circuit 30, which is a device such as a Random Access Memory (RAM). The random access memory 30 includes a plurality of shift register latches 37 that are located in a first stage 36, a second stage 38 and an Nth stage 40. The plurality of shift register latches 37 that are configured in the logic circuit 30 or RAM, stores data that is provided from a data source 41 via data bus 39 into each shift register latch that is connected to the data bus 39 by input lines 43.

Input connecting logic 33 is connected to the first stage 36 via data bus 31 which also connects each of the stages, the second stage 38 and the Nth stage 40. Data bus 31 is also connected to an output connecting logic 35. The input connecting logic 33 may be additional RAM logic circuits or other circuits that are connected to the data bus 31 or other types of circuits normally encountered within memory, microprocessor, or computer environments. Output connecting logic 35 may be a device such as additional memory circuits or other logic circuits or output terminals for connecting to an output device. Data bus 49 also provides outputs from each shift register latch to the output connecting logic 35. A clock generator 45 generates the clock signals that are used to load and shift data within each shift register latch 37 and provides these clocks via data bus 47 to each shift register latch.

Figure 4:
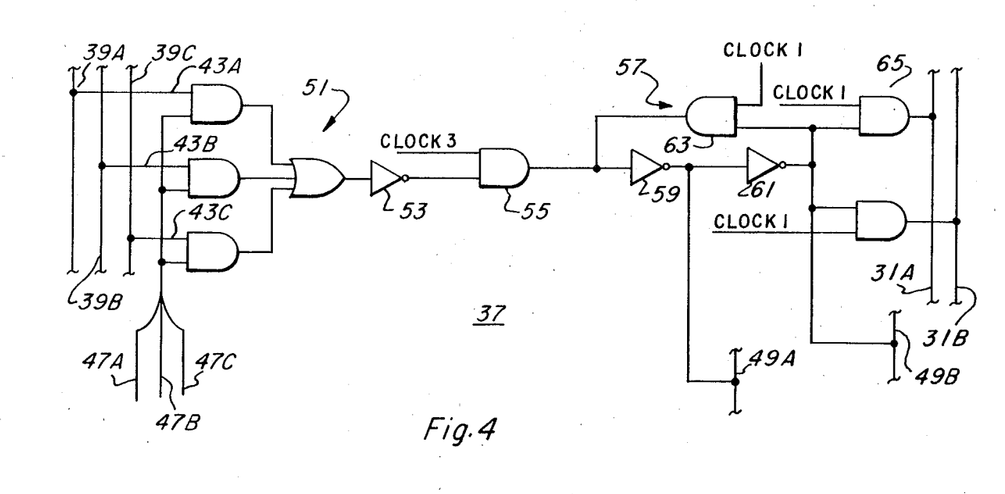
FIG. 4 is a schematic diagram of the shift register latch according to the invention.

FIG. 4 is a logic diagram of each shift register latch 37 and has an important combination logic 51 which receives the input data from input lines 43 and data bus 39, as well as the clock signals via bus 47 and applies these signals to an inverter 53. A clock which occurs after the clocks that are used to clock the data in via the combination logic 51 is used to gate the output of the inverter 53 with the "AND" gate 55 and pass the output logic therefrom to latch circuit 57. The combination logic 51 not only enables the combining of logic signals for application to the shift register latch, but in conjunction with the inverter 53 and the and gate 55 provides isolation between the shift register latch 57 and the clocks that are on the lines 47 and the data that is on the data lines 39.

The latch circuit is configured by the series combination of inverters 59 and 61 with a refresh circuit provided in the form of a feedback loop that connects the output of inverter 61 to the input of inverter 59 via "AND" gate 63, which periodically refreshes the data that is stored on the input of the "AND" gate 55. The periodic rate in the embodiment shown is the occurrence of every clock 1 signal. The output of the inverter 61 is provided on data line 49B and the output of inverter 53 a monitoring line 49A. A buffer circuit provides additional buffering for the output via buffer 65 and will isolate the latch 57 from the data lines 31.

Figure 5:
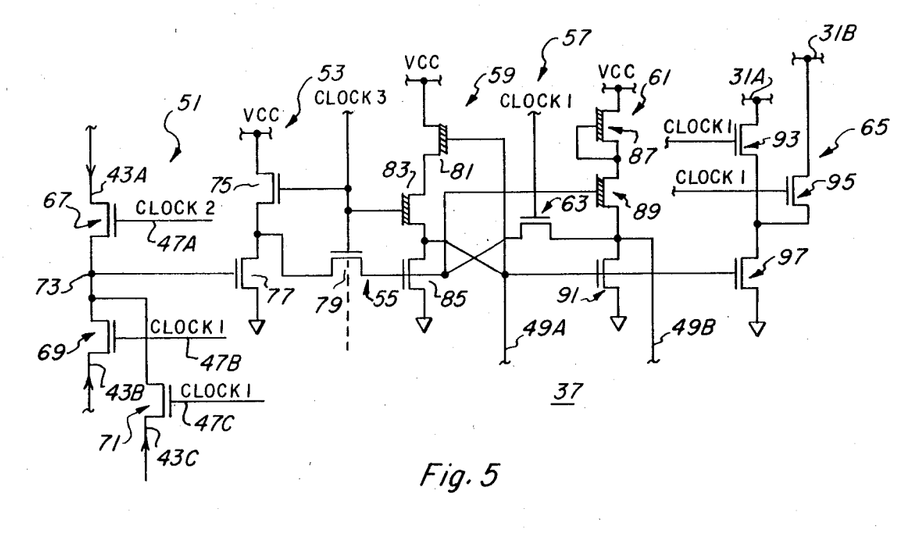
FIG. 5 is a circuit diagram of the shift register latch according to the invention.

In FIG. 5, to which reference should now be made, there is shown a schematic diagram of each shift register latch 37, in which the combination logic 51 is comprised of field effect transistors 67, 69, and 71, whose drains are connected together at node 73. The sources are the input terminals 43A, 43B, and 43C, respectively. The gates of the field effect transistor devices 69 and 71, in the embodiment shown in FIG. 5, are clocked by a clock that is designated as clock 1, and the gate of the field effect transistor 67 is clocked by clock 2, which is applied to the field effect transistor 67 via terminal 47A. The first inverter 53 is defined as an enhancement load and is clocked with the clock that loads the latch 57. The inverter 53 includes two field effect transistors 75 and 77. The field effect transistor 75 is clocked by the same clock that clocks the "AND" gate 55 of FIG. 4. The "AND" gate 55 in FIG. 5 is represented as a field effect transistor 79, which connects the drain of transistor 77 to the gate of a field effect transitor 85 that is part of the inverter 59. The inverter 59 is also clocked by the same clock that clocks the inverter 53 and the "AND" gate 55 in the embodiment shown. However, when the clock signal, clock 3, is high, the inverter 59, which is defined as a depletion load is very active, and when it is low, it goes into a state where its impedance is very much higher so that the current through the inverter stage is very low and consequently, the power consumed via the inverter 59 is also low. This is achieved through the use of the enhancement transistor 85, wherein the input is applied to its gate from the "AND" gate 55 or field effect transistor 79. The inverter includes the series combination of a depletion transistor 81, whose source is connected to Vcc, a bias voltage from a source not shown, and drain is connected to the source of a second field effect transistor 83, which is also a depletion-type transistor. The gate of the transistor 83 as discussed earlier, is connected to clock 3. The drain of the transistor 83 is connected to the source of the field effect transistor 85, whose drain is connected to, as indicated by the ground symbol, a referenc potential.

A first output from the latch, of course, is provided from conductor 49A, which is also connected to the gate of the depletion transistor 81. Additionally, conductor 49A can be monitored, and from that, indication of what is stored on the gate of the field effect transistor 85, i.e., the logic state can be determined.

The inverter 61 includes a series combination of a depletion field effect transistor 87 whose source is connected to Vcc and whose drain is connected to the source of a field effect transistor 89. The gate of the field effect transistor 87 is connected to its drain and as was discussed earlier, the overall circuit is arranged to provide low power operation, as in the case of inverter 59. The drain of the depletion field effect transistor 89 is connected to the source of the enhancement field effect transistor 91 whose drain is connected to the reference potential. An output is provided from the source of the field effect transistor 91 via conductor 49B, which can also be used to monitor the state of the latch 57. The feedback circuit, i. e., conductor 49B, is connected to the gate of transistor 85 by field effect transistor 63. The output buffer circuit 65 includes a series combination of two parallel field effect transistors 93 and 95, which are clocked in the embodiment shown by clock 1, and whose sources are connected to the data bus and in particular, to conductors 31A and 31B, and whose drains are connected together and to the source of a field effect transistor 97 whose drain is connected to a reference potential.

In a test mode a check pattern is applied to conductor 43A and loaded into inverter 53 at the occurrence of clock 2. At clock 3, the data is transferred to the first inverter 59 by the inverter 53 and the "AND" gate 55. At the following clock 1 the data is available on conductor 49A for observation to insure that the data pattern that was loaded in via conductor 43A is of the proper logic state. The shift register latch 37 operates under this test condition in the same manner as it does in the operate condition with the exception that clock 2 rather than clock 1 may be used to activate combination logic 51 for the loading of data into the shift register latch. The availability of the data on conductors 49A, 49B, as well as conductors 31A, and 31B facilitates the checking of each stage of the shift shift register latch.

The output inverter 61 essentially operates as a push-pull type circuit, as does the input inverter 59, and consequently, the devices are very fast with a high rate of switching speed. These devices are unique in that they are very fast yet they have a long load. Long load is defined in an MOS transistor as the width over the length of the gate area. The higher the ratio the more capable the device is of driving large loads. This terminology will be discussed and defined in greater detail in conjunction with FIG. 7.

Figure 6:
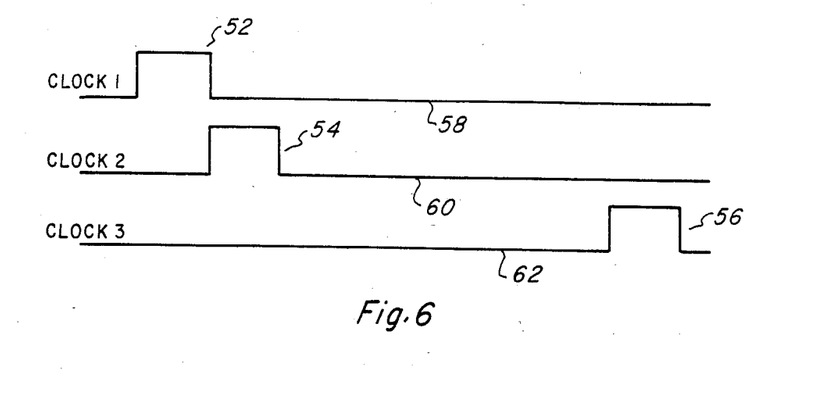
FIG. 6 is a timing diagram of the clock signals used to operate the shift register latches of FIGS. 3, 4 and 5.

FIG. 6 is an illustration of the clock diagram in which clock 1 is represented by waveform 58 and is indicated by pulse 52, and occurs earlier in time than any of the other clocks that occur within a clock cycle. Clock 2 is represented by waveform 60 and has a pulse 54 that occurs after the occurrence of pulse 52. Waveform 62 represents clock 3 in which pulse 56 occurs after both clock 1 and clock 2 pulses 52 or 54, respectively, have elapsed. Clock 2 is used in the scan mode to provide on conductor 49A the status of the data that is stored within the field effect transistor 85. Clocks 1 and 2, of course, must occur before clock 3 so that data will be present and stored in the gate area of the inverter 53 for application to the latch 57 so that at the occurrence of clock 1 the latch 57 stores the data that is passed by gate 55 to the gate of the field effect transistor 85 and the complement thereof on the gate of the field effect transistor 91. The field effect transistor 91 provides on conductor 49B the complement of the output of the field effect transistor 85, which of course is identical to the signal that is applied thereto via the "AND" gate 55 or the feedback circuit that includes the AND gate 63.

Figure 7:
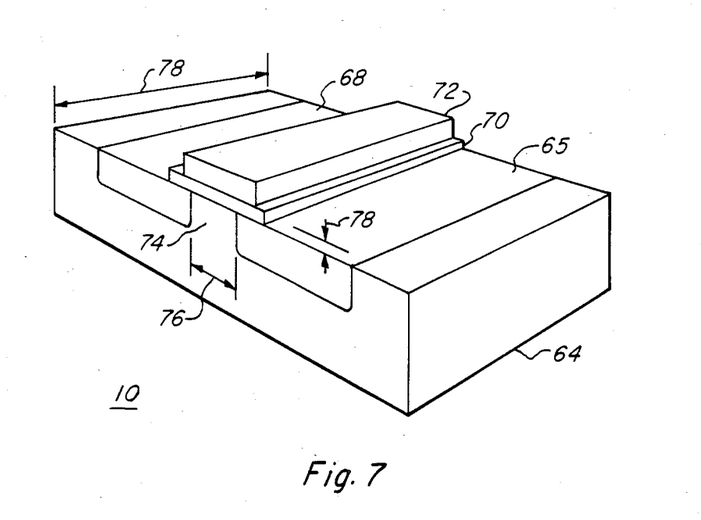
FIG. 7 is an isometric view of each transistor according to the invention.

In FIG. 7, to which reference should now be made, there is shown an isometric diagram of a field effect transistor that could be used to implement the transistors of the above figures. Each transistor has a substrate 64, a drain which is a semiconductor material 65, a source which is of the same material that the drain is made in and is represented at 68, a gate 74 that is of the same semiconductor material of the substrate 64 and includes an oxide layer 70 that covers not only the gate but a portion of the source 68 and the drain 65 and a metal material 72 that is connected to the oxide layer 70. The gate area stores data by isolating a charge on a capacitance that is associated with each gate of a field effect transistor. The capacitance of the gate, C, is equal to $\Sigma 0$, the permability of free space, which is a constant times $\Sigma x$, which is the relative permability of the oxide layer 70 and $T_{ox}$, which is equal to the gate oxide thickness that is represented by the dimension line 78. As was discussed earlier, long loads and short loads type of transistor are defined by the width of the gate to the length of the gate. Dimension lines 76 represent the length and dimension lines 78 represent the width. In the embodiment shown in FIG. 7, of course the ratio of the width to the length is a large number. Table 1 provides the ratios of the field effect transistors according to the reference numbers of FIG. 5, and the ratios that are used in the embodiment shown in FIG. 5. Some ratios are given as fractions, such as device 75 which is given as 4/4. A ratio shown as the number 1 would not convey much information. The 4/4 indicates the width is equal to the length and that each is 4 micrometers in length.

Figure 8:
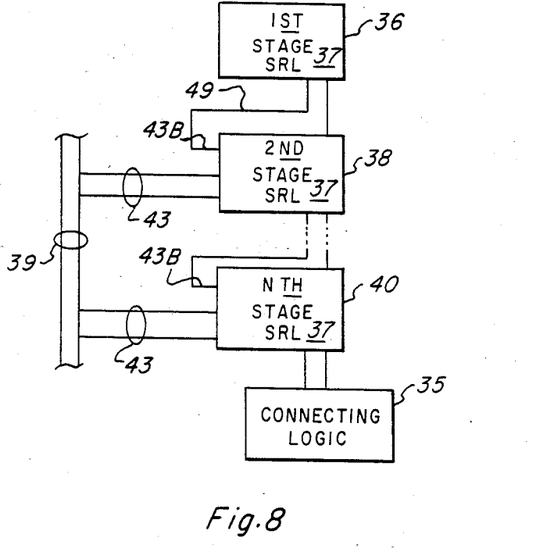
FIG. 8 is an alternate embodiment of the invention.

FIG. 8 is an alternative embodiment of the device shown in FIG. 3, in which actual shift register latch is implemented by the carrying of conductor 49B to the input of the second stage shift register latch 38 and 43B to the Nth stage of a shift register latch input.

Although the present invention has been described in relation to the specific embodiment, it will be clearly understood by those skilled in the art that other optional features may be included in the shift register latch, or substituted as described without departing from the scope of the invention.

TABLE 1

| Device Reference Number | Width/Length Ratios | | |
|---|---|---|---|
| 63 | 5/3 | or | 1.66 |
| 67 | 5/3 | | 1.66 |
| 69 | 10/3 | | 3.33 |
| 71 | 10/3 | | 3.33 |
| 75 | 4/4 | | 1 |
| 77 | 20/3 | | 6.67 |
| 79 | 7/3 | | 2.33 |
| 81 | 4/4 | | 1. |
| 83 | 4/4 | | 1. |
| 85 | 20/3 | | 6.67 |
| 87 | 4/20 | | 0.25 |
| 89 | 4/4 | | 1.0 |
| 91 | 10/3 | | 3.33 |
| 93 | 20/3 | | 6.67 |
| 95 | 30/3 | | 10. |
| 97 | 80/3 | | 2.67 |

What is claimed is:

1. A logic circuit for a shift register stage comprising: latch means (57) for storing data including (a) first (59) and second (61) field effect device inverters each having an input terminal and an output terminal, said input terminal of said first field effect device inverter being the input terminal of said latch means, said output terminal of said first field effect device inverter connected to said input terminal of said second field effect device inverter, each of said field effect device inverters having an enhancement mode field effect device (85, 91) having a gate connected to said inverter input terminal, a source connected to said inverter output terminal and a drain connected to a reference potential, a first depletion mode field effect device (82, 89) having a gate, said gate of said first depletion mode field effect device (82) of said first field effect inverter receiving an isolation clock signal (clock 3) and said gate of said first depletion mode field effect device (89) of said second field effect inverter being connected to said input of said first field effect device inverter, a drain connected to the source of said first enhancement field effect device and a source for receiving a bias signal, and a second depletion mode field effect device (81, 87) having a gate, said gate of said second depletion mode field effect device (81) of said first field effect inverter being connected to said output of said first field effect inverter and said gate of said second depletion mode field effect device (87) of said second field effect inverter being connected to its drain, a drain connected to the source of said first depletion field effect device and a source for receiving a bias potential, and (b) a controllable feedback circuit means (63) selectively connecting the output terminal of said second field effect device inverter to the input terminal of said first field effect device inverter; and isolation means (55) connected to said latch means (57) having a isolation clock signal input for connecting an input signal to said input terminal of said latch means when said isolation clock signal is in a first state and for isolating said latch means from said input signal when said isolation clock signal is in a second state.

2. A logic circuit for a shift register stage as claimed in claim 1, wherein:

said controllable feedback circuit means of said latch means includes a field effect device having a gate for receiving a feedback clock signal (clock 1), a source connected to said output of said second field effect device inverter and a drain connected to said input of said first field effect device inverter, whereby said output of said second field effect device inverter is connected to said input of said first field effect device inverter when said feedback block signal is in a first state and said output of said second field effect device inverter is isolated from said input of said first field effect device inverter when said feedback clock signal is in a second state.

3. A logic circuit for a shift register stage as claimed in claim 1, wherein said isolation means includes:

an input combination logic means connected to at least one input signal including an input field effect device for each input signal having a source for receiving a corresponding input signal, a drain connected to a common node and having a gate receiving a corresponding input clock signal (clock 1);

an inverter circuit including a third field effect device having a gate receiving said isolation clock signal, a source connected to said bias potential and a drain connected to said inverter circuit output and a fourth field effect device having a gate connected to said common node of said input combination logic means, a source connected to the drain of said third field effect device and a drain connected to a reference potential; and a gating circuit including a sixth field effect device having a gate receiving said isolation clock signal, a source connected to the output of said inverter circuit and a drain connected to the input of said latch means.

4. A logic circuit for a shift register stage as claimed in claim 3, further comprising:

a circuit checking means including a check input field effect device having a source receiving a checking input signal (43A), a drain connected to said common node of said input combination logic means and a gate receiving a checking clock signal (clock 2), and a checking output line (49B) connected to said output of said first field effect device inverter.

* * * * *